United States Patent
Toronyi et al.

(10) Patent No.: US 9,104,540 B2
(45) Date of Patent: Aug. 11, 2015

(54) DYNAMIC MEMORY PERFORMANCE THROTTLING

(75) Inventors: Brian Toronyi, Austin, TX (US); Kenneth Shoemaker, Los Altos Hills, CA (US)

(73) Assignee: Intel Corporation, Santa Clara, CA (US)

( * ) Notice: Subject to any disclaimer, the term of this patent is extended or adjusted under 35 U.S.C. 154(b) by 192 days.

(21) Appl. No.: 13/997,977

(22) PCT Filed: Dec. 23, 2011

(86) PCT No.: PCT/US2011/067285
§ 371 (c)(1), (2), (4) Date: Jun. 25, 2013

(87) PCT Pub. No.: WO2013/095675
PCT Pub. Date: Jun. 27, 2013

(65) Prior Publication Data
US 2014/0013070 A1    Jan. 9, 2014

(51) Int. Cl.
| G06F 12/00 | (2006.01) |
| G11C 11/402 | (2006.01) |
| G11C 11/406 | (2006.01) |
| G11C 11/4063 | (2006.01) |
| G11C 7/04 | (2006.01) |
| G11C 7/10 | (2006.01) |
| G11C 11/4076 | (2006.01) |
| G11C 11/4096 | (2006.01) |
| G11C 5/02 | (2006.01) |

(52) U.S. Cl.
CPC *G06F 12/00* (2013.01); *G11C 7/04* (2013.01); *G11C 7/10* (2013.01); *G11C 11/402* (2013.01); *G11C 11/406* (2013.01); *G11C 11/4063* (2013.01); *G11C 11/4076* (2013.01); *G11C 11/4096* (2013.01); *G11C 5/025* (2013.01); *G11C 2207/2254* (2013.01)

(58) Field of Classification Search
None
See application file for complete search history.

(56) References Cited

U.S. PATENT DOCUMENTS

| 6,714,156 B1 | 3/2004 | Ibrahim et al. |
| 7,064,994 B1 | 6/2006 | Wu |
| 2005/0289292 A1* | 12/2005 | Morrow et al. ............... 711/105 |
| 2006/0007759 A1 | 1/2006 | Silvestri |
| 2010/0182855 A1 | 7/2010 | Koshizuka |

FOREIGN PATENT DOCUMENTS

KR  10-2011-0129149    12/2011

OTHER PUBLICATIONS

International Search Report and Written Opinion of the International Searching Authority dated Sep. 17, 2012, in International Patent Application No. PCT/US2011/067285, 6 pages.
Official Letter dated Mar. 26, 2015 (+ English translation), in Taiwan Patent Application No. 101145668, 9 pages.

* cited by examiner

*Primary Examiner* — Duc Doan
(74) *Attorney, Agent, or Firm* — Blakely, Sokoloff, Taylor & Zafman LLP (57) ABSTRACT

Dynamic memory performance throttling. An embodiment of a memory device includes a memory stack including coupled memory elements; the memory elements including multiple ranks, the plurality of ranks including a first rank and a second rank, and a logic device including a memory controller. The memory controller is to determine an amount of misalignment between data signals relating to a read request for the first rank and a read request for the second rank, and, upon determining that misalignment between the first rank and the second rank is greater than a threshold, the memory controller is to insert a time shift between a data signal for the first rank and a data signal for the second rank.

23 Claims, 8 Drawing Sheets

FIG. 1

Performance
Throttling Insertion of
Cycle Bubble Between
Read Requests
205

DYNAMIC MEMORY PERFORMANCE THROTTLING

TECHNICAL FIELD

Embodiments of the invention generally relate to the field of electronic devices and, more particularly, to dynamic memory performance throttling.

BACKGROUND

To provide memory with additional density for various kinds of computing operations, memory devices having a plurality of closely coupled memory elements (which may be referred to as 3D stacked memory, or stacked memory) are being developed.

A 3D stacked memory may include coupled layers or packages of DRAM (dynamic random-access memory) memory elements, which may be referred to as a memory stack. Stacked memory may be utilized to provide a great amount of computer memory in a single device or package, where the device or package may further include system components, such as a memory controller and CPU (central processing unit) or other system elements.

However, in a larger memory structure such as a stacked memory device signals may become misaligned. In a conventional apparatus or operation, memory signals may be halted to realign the signals, but the halting of operation for signal realignment creates a performance cost for an apparatus or system using the memory device.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Embodiments of the invention are generally directed to dynamic operations for 3D stacked memory using thermal data.

As used herein:

"3D stacked memory" (where 3D indicates three-dimensional) or "stacked memory" means a computer memory including multiple coupled memory layers, memory packages, or other memory elements. A 3D stacked memory may include a WideIO memory device. The memory may be vertically stacked or horizontally (such as side by side) stacked, or otherwise contain memory elements that are coupled together. In particular, a stacked memory DRAM device or system may include a memory device having a plurality of DRAM die layers. A stacked memory device may also include system elements in the device, which may be referred to herein as a system layer, where the system layer includes elements such as a CPU (central processing unit), a memory controller (such as a WideIO memory controller), and other related system elements. The system layer may include a system on chip (SoC). In some embodiments, the logic chip may be an application processor or graphics processing unit (GPU). A 3D stacked memory may include, but is not limited to, a WideIO memory device.

In operation, traffic in a stacked memory device may become unaligned over time. Unequal heat gradients generated by the stacked memory device cause shifts in signal alignment. For example, a WideIO DRAM die heats up in operation, with resulting heat gradients causing the different ranks of the memory device to become unaligned. However, misalignment may be caused by other factors, including timing characteristics of the memory device, and embodiments are not limited to misalignment caused by heat gradients or other specific cause of misalignment. If the misalignment grows too large, the result may cause data errors, and may violate certain standard requirements. In an example, WideIO DRAMs are required to provide rank-to-rank timing accuracy to within 500 psec (picoseconds) between ranks across PVT (process, voltage, and temperature) variations.

In tuning a system, WideIO DRAMs may insert variable delays into the DQ (Data) and DQS (Data Strobe Signal) generation circuits to maintain alignment. WideIO controllers include phase discrimination circuits to determine (within 100 psec) the relative arrival times of two pulses on different DQ lines. However, the heat gradient of the memory stack or other factors may still result in misalignment. In conventional operation, detected misalignment of data above a certain threshold is addressed by halting data traffic for realignment. In a WideIO system, a conventional function requires that Wide IO DRAM traffic be stopped for a period of time once the different DRAM rank data and data strobe signals become unaligned, where the halting of the DRAM traffic allows for a realignment of the different ranks data and data strobe. However, the halting of data traffic creates a performance penalty in the operation of the memory.

In some embodiments, an apparatus or system operates to address misalignment of data between ranks of a memory device by throttling operation of the memory device without halting the DRAM traffic. In some embodiments, a throttling operation for a memory device includes insertion of a "bubble" by a memory controller to allow for alignment modification while continuing operation. In some embodiments, the bubble is a temporary one-cycle time shift between rank to rank read requests to modify alignment between ranks. In some embodiments, an apparatus or system allows for pending DRAM traffic to proceed without stalling for a lengthy realignment process.

In some embodiments, the apparatus or system provides for removal of the bubble when memory operations become reduced or settled. In some embodiments, when memory traffic, such as WideIO DRAM traffic, has been reduced and the WideIO memory controller is attempting to take an action in response to the reduced traffic, such as to either power down the DRAM interface or place the DRAM in self-refresh, then the memory controller is to conduct a rank realignment process and removes the one-cycle bubble for different rank read requests.

In some embodiments, a memory device includes a memory stack including coupled memory elements, the memory elements including multiple ranks, the plurality of ranks including a first rank and a second rank, and a logic device including a memory controller. The memory controller is to determine an amount of misalignment between data signals relating to a read request for the first rank and a read request for the second rank, and, upon determining that misalignment between the first rank and the second rank is greater than a threshold, the memory controller is to insert a time shift between a data signal for the first rank and a data signal for the second rank.

In some embodiments, a method includes operating a stacked memory device, the memory device including a memory stack including a plurality of coupled memory elements, the memory elements including a plurality of ranks, the plurality of ranks including a first rank and a second rank. The method includes determining an amount of misalignment between data signals relating to a read request for the first rank and a read request for the second rank; and upon determining that misalignment between the first rank and the second rank is greater than a threshold, inserting a time shift between a data signal for the first rank and a data signal for the second rank.

Figure 1:
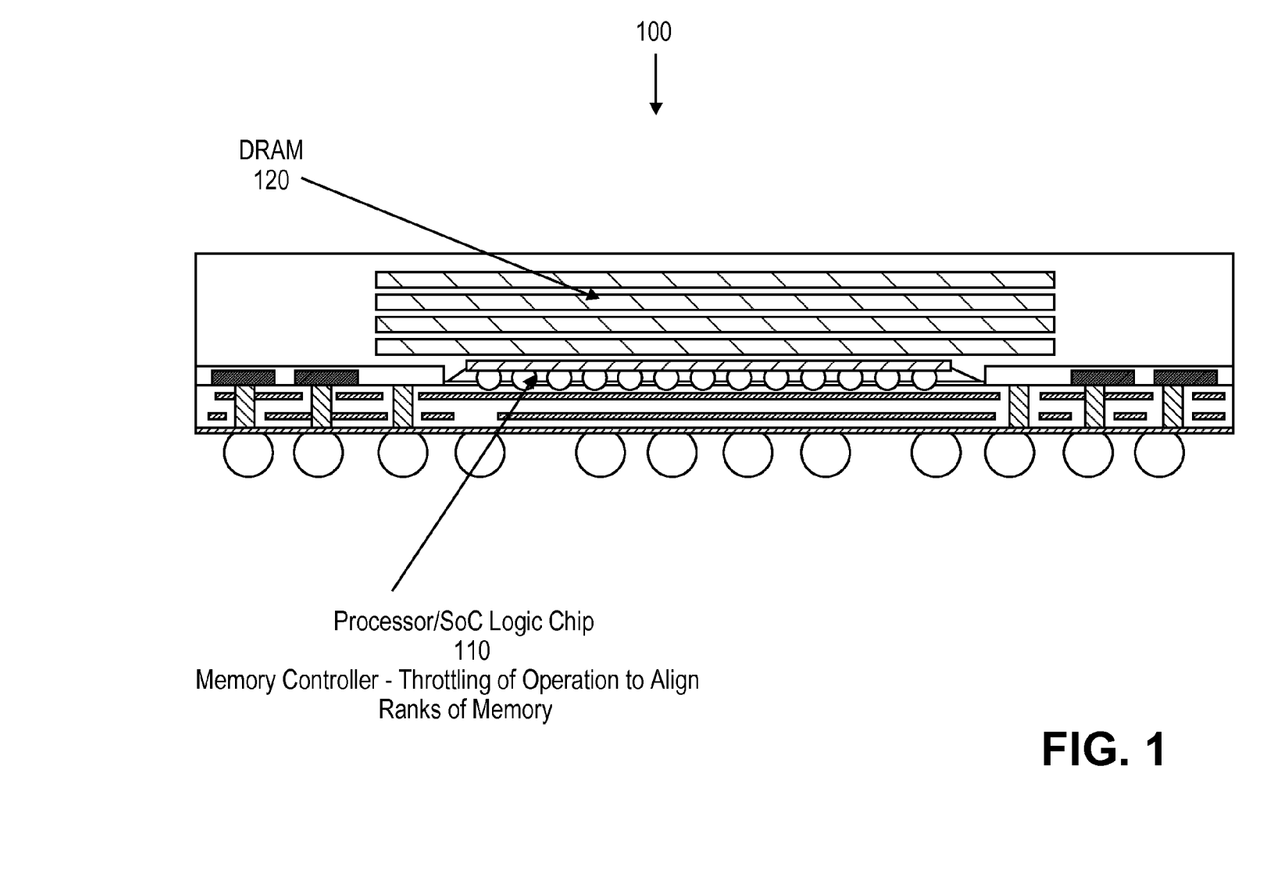
FIG. 1 is an illustration of embodiment of a stacked memory device.

FIG. 1 is an illustration of embodiment of a stacked memory device. In some embodiments, a stacked memory device 100 (such as a WideIO memory device) includes a memory stack including one more DRAM die layers 120 that is closely coupled with a logic chip 110, which may be an SoC or other system element. In some embodiments, the logic chip 110 may include a memory controller. In some embodiments, the memory controller provides for throttling of operation of the memory to address misalignment of signals.

Figure 2:
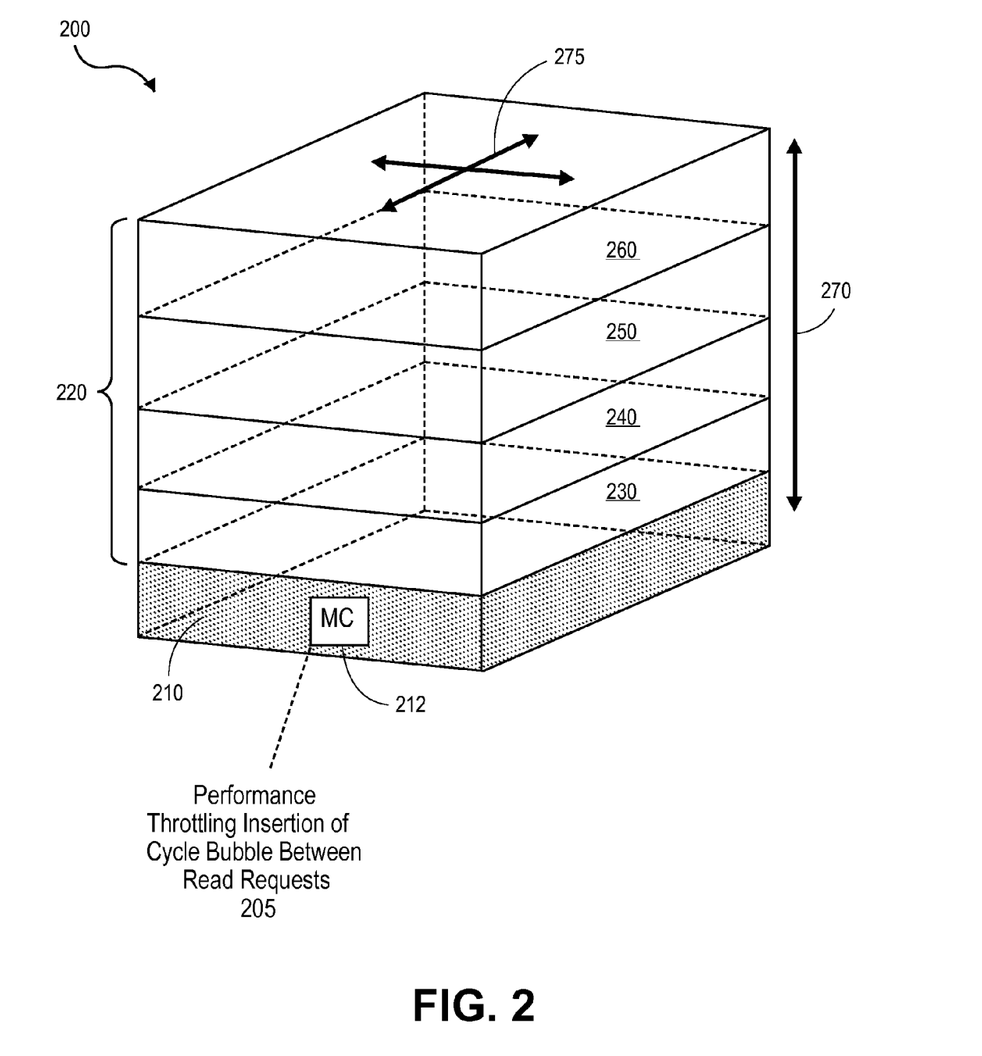
FIG. 2 illustrates an embodiment of a 3D stacked memory providing for performance throttling.

FIG. 2 illustrates an embodiment of a 3D stacked memory providing for performance throttling. In this illustration, a 3D stacked memory device 200 includes a logic chip system element 210 coupled with one or more DRAM memory die layers 220, also referred to herein as the memory stack, where the memory die layers may include one or more slices or portions, and may include one or more channels. In some embodiments, the logic chip 210 may be a system on chip (SoC) or other similar element. Each die layer may include a temperature compensated self-refresh (TCSR) circuit to address thermal issues, where the TCSR and a mode register (MR) may be a part of management logic of the device, and where the MC may include thermal offset bit(s) for adjustment of refresh rate by the TCSR. The die layers and the system element may be thermally coupled together. The elements of this figure and the following figures are presented for illustration, and are not drawn to scale.

While FIG. 2 illustrates an implementation in which the logic chip 210 is coupled below the memory stack of one or more memory die layers 220, embodiments are not limited to this arrangement. For example, in some embodiments a system element 210 may be located adjacent to the memory stack 220, and thus may be coupled in a side-by-side arrangement with the memory stack 220.

In this illustration, the DRAM memory die layers include four memory die layers, these layers being a first memory die layer 230, a second memory die layer 240, a third memory die layer 250, and a fourth memory die layer 260. However, embodiments are not limited to any particular number of memory die layers in the memory stack 220, and may include a greater or smaller number of memory die layers. Among other elements, the system element 210 may include a memory controller 212 for the memory stack 220. In some embodiments, each memory die layer (with the possible exception of the top, or outermost, memory die layer, such as the fourth memory die layer 260 in this illustration) includes a plurality of through silicon vias (TSVs) 205 to provide paths through the silicon substrate of the memory die layers.

However, in operation the memory 200 may develop one more temperature gradients, where temperature gradients may include vertical gradients 270, such as cooler areas nearer cooling fins or other cooling elements, and horizontal temperature gradients 275, such as differences between a hotter inner core and cooler outside portions of the memory stack 220. Among other effects, the thermal gradients may cause misalignment of the signals between ranks of the memory. In addition, other factors, including timing characteristics of the memory elements of a memory stack, may cause misalignment of signals.

In some embodiments, the logic chip 210 may include a memory controller, such as a WideIO memory controller. In some embodiments, the memory controller may address misalignment between ranks by performance throttling, rather than halting memory operation. In delays some embodiments, performance throttling includes the insertion of a time shift to adjust alignment, where a delay may specifically be a one-cycle bubble to shift signal alignment.

Figure 3:
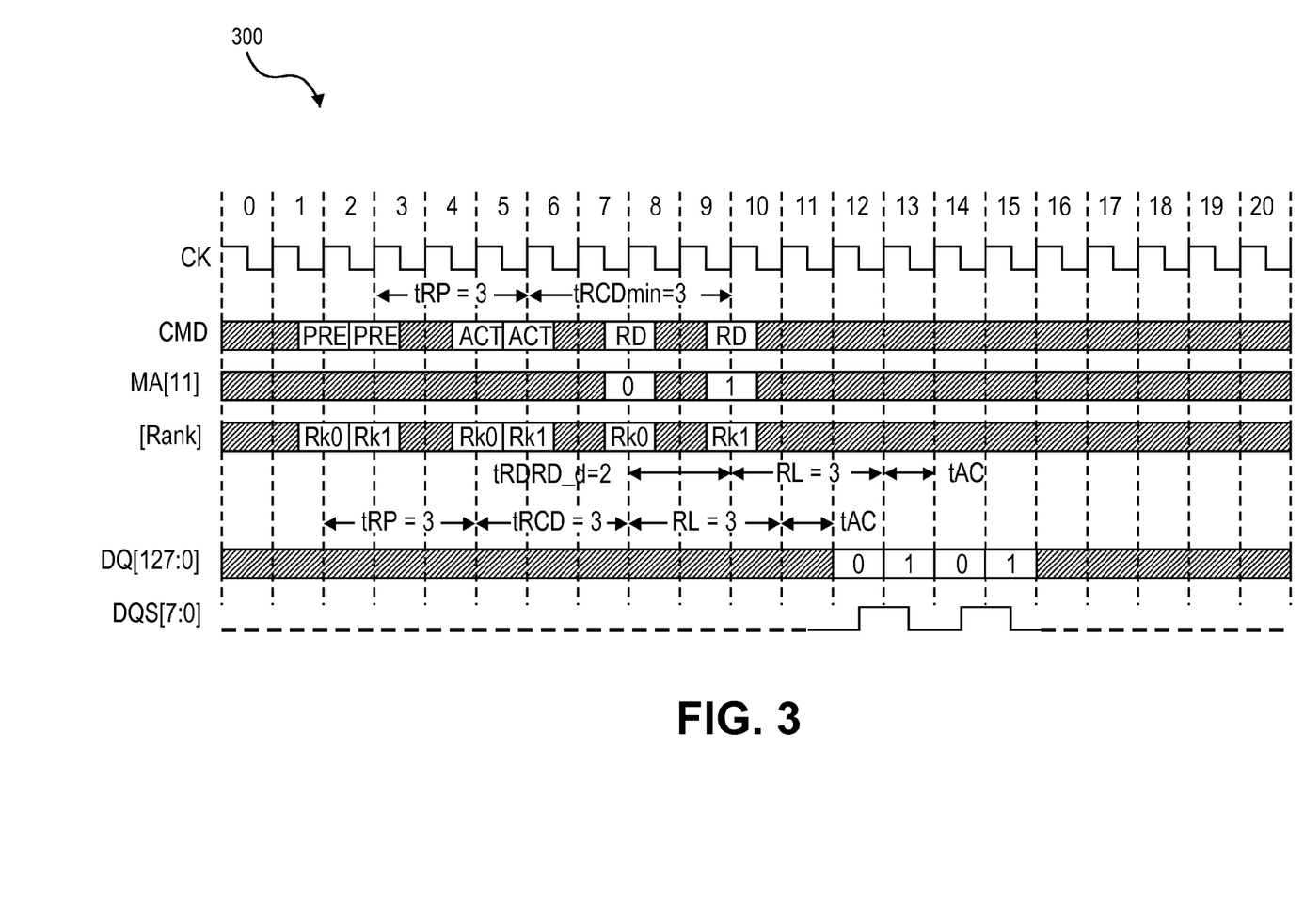
FIG. 3 is a timing diagram to illustrate timing of an embodiment of a memory device.

FIG. 3 is a timing diagram to illustrate timing of an embodiment of a memory device. In this illustration, the timing diagram 300 shows optimized rank to rank reads, where the timing between ranks (Rk0 and Rk1) is tRDRD_d–2. In such operation, the data DQ and strobe signals DQS to time data reads for each rank occur consecutively. However, if the rank-to-rank signal relationship becomes sufficiently misaligned, there is a risk of data error or operation that does not meet timing standards. In some embodiments, a one-cycle bubble is inserted to address misalignment without halting data traffic for realignment.

Figure 4:
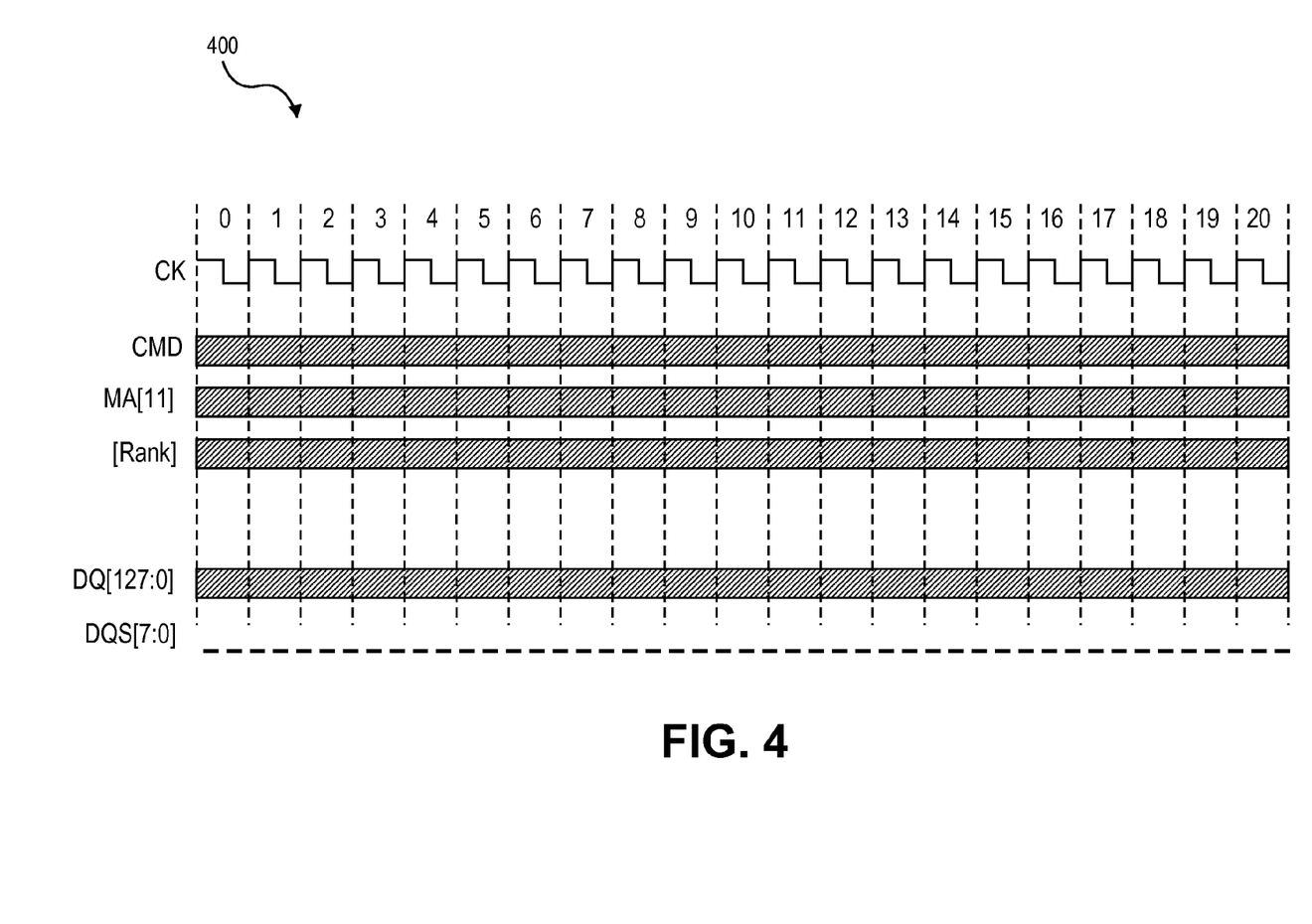
FIG. 4 is a timing diagram to illustrate realignment of rank-to-rank read requests.

FIG. 4 is a timing diagram to illustrate realignment of rank-to-rank read requests. If DRAM rank realignment is needed, then in a conventional operation the DRAM traffic is blocked for realignment, as shown in 400. The performance cost is loss of all data traffic during the realignment.

Figure 5:
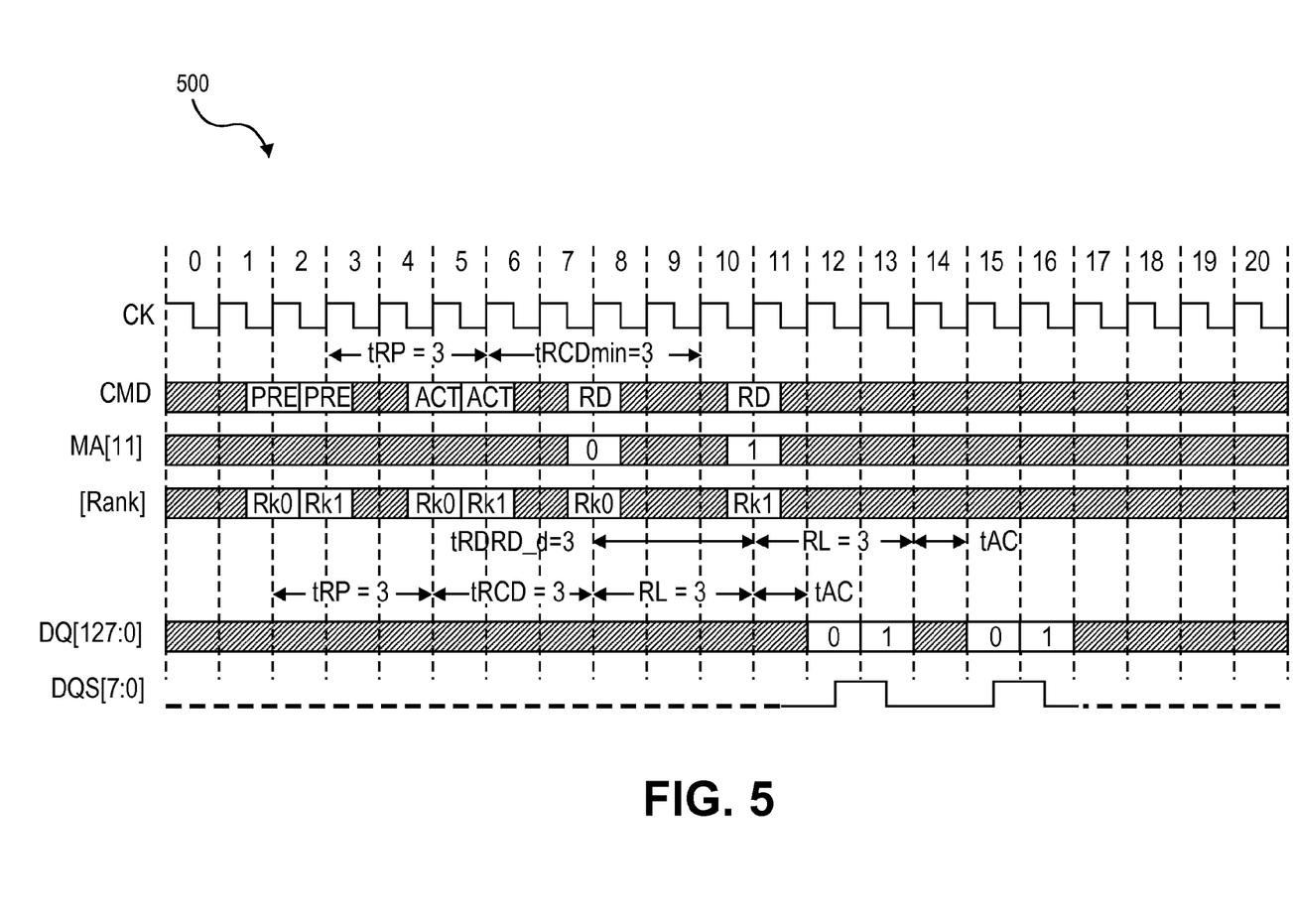
FIG. 5 is a timing diagram to illustrate an embodiment of performance throttling to address misalignment.

FIG. 5 is a timing diagram to illustrate an embodiment of performance throttling to address misalignment. In some embodiments, DRAM rank alignment is needed, but the memory controller throttles performance of the memory, instead of blocking DRAM traffic. As illustrated, the controller inserts a one-cycle bubble between Rank 0 data returns and Rank 1 data returns. As shown in 500, the insertion of the bubble ensures no electrical contention on the DQ or DQS lines between Rank0 memories and Rank1 memories.

Figure 6:
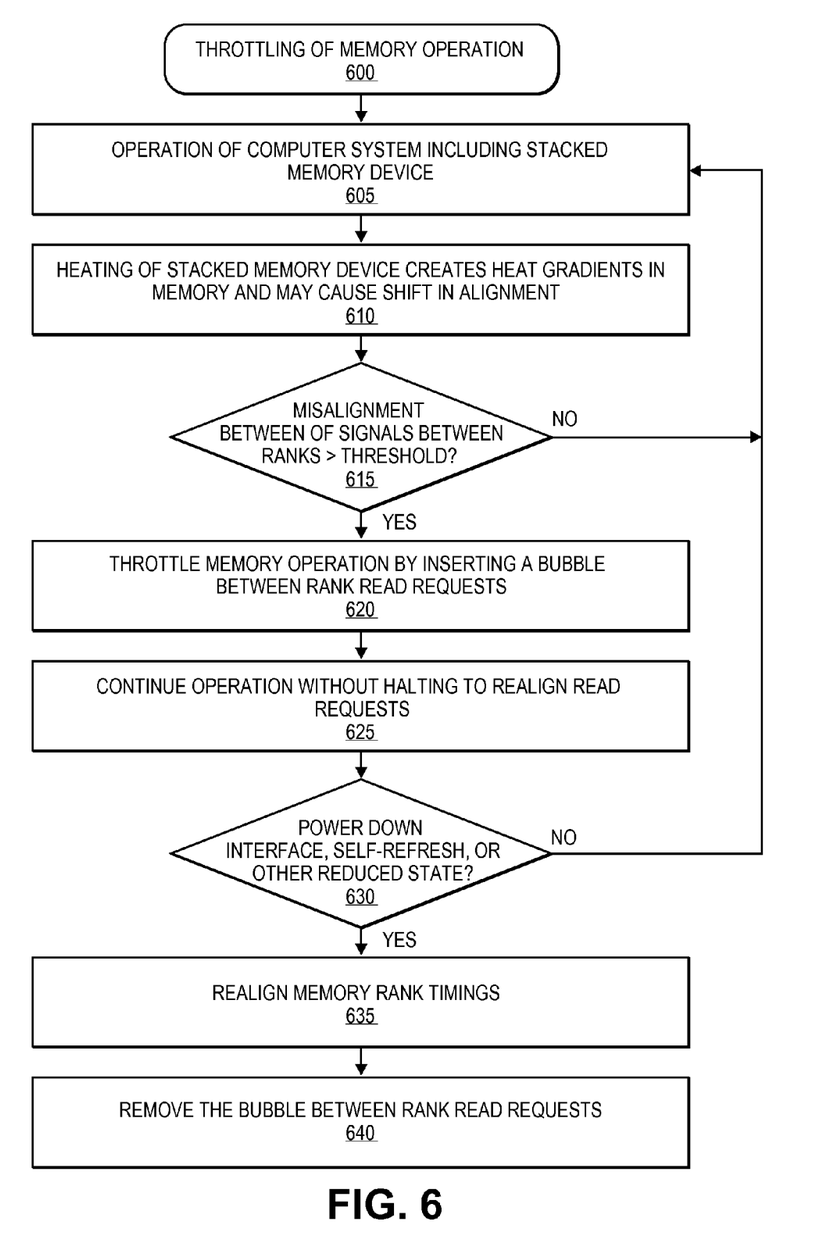
FIG. 6 is a flowchart to illustrate an embodiment of a method for throttling of memory operations to address misalignment of signals.

FIG. 6 is a flowchart to illustrate an embodiment of a method for throttling of memory operations to address misalignment of signals 600. In this illustration, an operation of a computer system includes the operation of a stacked memory device 600, where the stacked memory device may include a WideIO memory device. During operation, the heating of the stacked memory device creates heat gradients through the memory device, and may cause shifts in alignment between ranks for read signals 610. However, other factors may also cause misalignment, and embodiments are not limited to misalignment induced by heat gradients.

In some embodiments, if the misalignment between signals is greater than a certain threshold 615, such as 500 psec for a WideIO memory device, then the memory controller of the memory device operates to throttle the memory operation by inserting one or more one-cycle bubbles to generate sufficient time shift for correction of the misalignment 620. In some embodiments, the memory device continues operation without halting to realign read requests 625.

In some embodiments, upon the computing system reaching a point for power down, self-refresh, or other state when memory operations are reduced 630, the memory controller may act to realign the memory, including realigning the memory rank timings for the memory 635 and the removal of the one or more bubbles between read requests 640.

Figure 7:
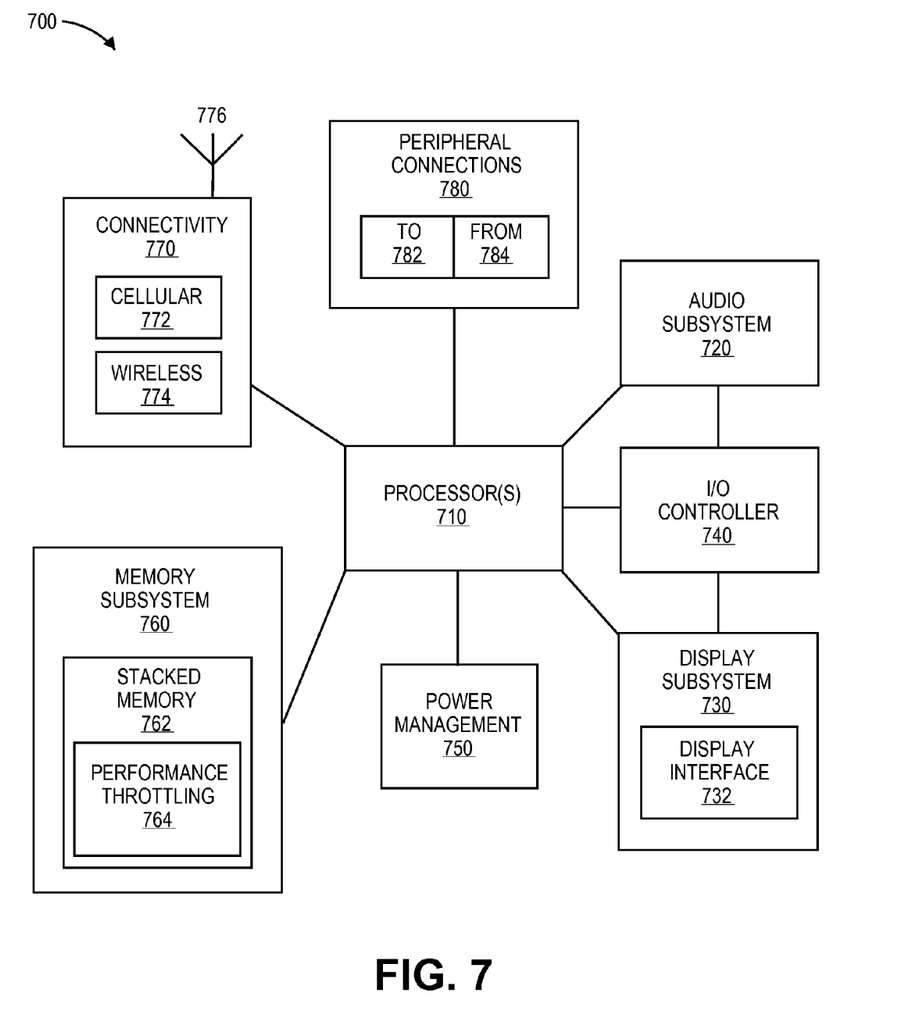
FIG. 7 is a block diagram to illustrate an embodiment of a mobile computing device including a stacked memory device.

FIG. 7 is a block diagram to illustrate an embodiment of a mobile computing device including a stacked memory device. Computing device 700 represents a computing device including a mobile computing device, such as a laptop or notebook computer, a netbook, a tablet computer (including a device having a touchscreen without a separate keyboard; a device having both a touchscreen and keyboard; a device having quick initiation, referred to as "instant on" operation; and a device that is generally connected to a network in operation, referred to as "always connected"), a mobile phone or smartphone, a wireless-enabled e-reader, or other wireless mobile device. It will be understood that certain of the components are shown generally, and not all components of such a device are shown in device 700. The components may be connected by one or more buses or other connections 705.

Device 700 includes processor 710, which performs the primary processing operations of device 700. Processor 710 can include one or more physical devices, such as microprocessors, application processors, microcontrollers, programmable logic devices, or other processing means. The processing operations performed by processor 710 include the execution of an operating platform or operating system on which applications, device functions, or both are executed. The processing operations include operations related to I/O (input/output) with a human user or with other devices, operations related to power management, operations, or both related to connecting device 700 to another device. The processing operations may also include operations related to audio I/O, display I/O, or both.

In one embodiment, device 700 includes audio subsystem 720, which represents hardware (such as audio hardware and audio circuits) and software (such as drivers and codecs) components associated with providing audio functions to the computing device. Audio functions can include speaker, headphone, or both such audio output, as well as microphone input. Devices for such functions can be integrated into device 700, or connected to device 700. In one embodiment, a user interacts with device 700 by providing audio commands that are received and processed by processor 710.

Display subsystem 730 represents hardware (such as display devices) and software (such as drivers) components that provide a display having visual, tactile, or both elements for a user to interact with the computing device. Display subsystem 730 includes display interface 732, which includes the particular screen or hardware device used to provide a display to a user. In one embodiment, display interface 732 includes logic separate from processor 710 to perform at least some processing related to the display. In one embodiment, display subsystem 730 includes a touchscreen device that provides both output and input to a user.

I/O controller 740 represents hardware devices and software components related to interaction with a user. I/O controller 740 can operate to manage hardware that is part of audio subsystem 720, a display subsystem 730, or both such subsystems. Additionally, I/O controller 740 illustrates a connection point for additional devices that connect to device 700 through which a user might interact with the device. For example, devices that can be attached to device 700 might include microphone devices, speaker or stereo systems, video systems or other display device, keyboard or keypad devices, or other I/O devices for use with specific applications such as card readers or other devices.

As mentioned above, I/O controller 740 may interact with audio subsystem 720, or display subsystem 730, or both such subsystems. For example, input through a microphone or other audio device can provide input or commands for one or more applications or functions of device 700. Additionally, audio output can be provided instead of or in addition to display output. In another example, if display subsystem includes a touchscreen, the display device also acts as an input device, which can be at least partially managed by I/O controller 740. There can also be additional buttons or switches on device 700 to provide I/O functions managed by I/O controller 740.

In one embodiment, I/O controller 740 manages devices such as accelerometers, cameras, light sensors or other environmental sensors, or other hardware that can be included in device 700. The input can be part of direct user interaction, as well as providing environmental input to the device to influence its operations (such as filtering for noise, adjusting displays for brightness detection, applying a flash for a camera, or other features).

In one embodiment, device 700 includes power management 750 that manages battery power usage, charging of the battery, and features related to power saving operation.

In some embodiments, memory subsystem 760 includes memory devices for storing information in device 700. The processor 710 may read and write data to elements of the memory subsystem 760. Memory can include nonvolatile (having a state that does not change if power to the memory device is interrupted), volatile (having a state that is indeterminate if power to the memory device is interrupted) memory devices, or both such memories. Memory 760 can store application data, user data, music, photos, documents, or other data, as well as device data (whether long-term or temporary) related to the execution of the applications and functions of device 700.

In some embodiments, the memory subsystem 760 may include a stacked memory device 762 including a memory stack of one more memory die layers and including performance throttling to address misalignment of read requests 764, where performance throttling includes insertion of a one-cycle bubble to address lack of alignment between ranks.

Connectivity 770 includes hardware devices (e.g., connectors and communication hardware for wireless communication, wired communication, or both) and software components (e.g., drivers, protocol stacks) to enable device 700 to communicate with external devices. The device could be separate devices, such as other computing devices, wireless access points or base stations, as well as peripherals such as headsets, printers, or other devices.

Connectivity 770 can include multiple different types of connectivity. To generalize, device 700 is illustrated with cellular connectivity 772 and wireless connectivity 774. Cellular connectivity 772 refers generally to cellular network connectivity provided by wireless carriers, such as provided via 4G/LTE (Long Term Evolution), GSM (global system for mobile communications) or variations or derivatives, CDMA (code division multiple access) or variations or derivatives, TDM (time division multiplexing) or variations or derivatives, or other cellular service standards. Wireless connectivity 774 refers to wireless connectivity that is not cellular, and can include personal area networks (such as Bluetooth), local area networks (such as Wi-Fi), wide area networks (such as WiMax), and other wireless communications. Connectivity may include one or more omnidirectional or directional antennas 776.

Peripheral connections 780 include hardware interfaces and connectors, as well as software components (e.g., drivers, protocol stacks) to make peripheral connections. It will be understood that device 700 could both be a peripheral device ("to" 782) to other computing devices, as well as have peripheral devices ("from" 784) connected to it. Device 700 may commonly include a "docking" connector to connect to other computing devices for purposes such as managing (such as downloading, uploading, changing, or synchronizing) content on device 700. Additionally, a docking connector can allow device 700 to connect to certain peripherals that allow device 700 to control content output, for example, to audio-visual or other systems.

In addition to a proprietary docking connector or other proprietary connection hardware, device 700 can make peripheral connections 780 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

Figure 8:
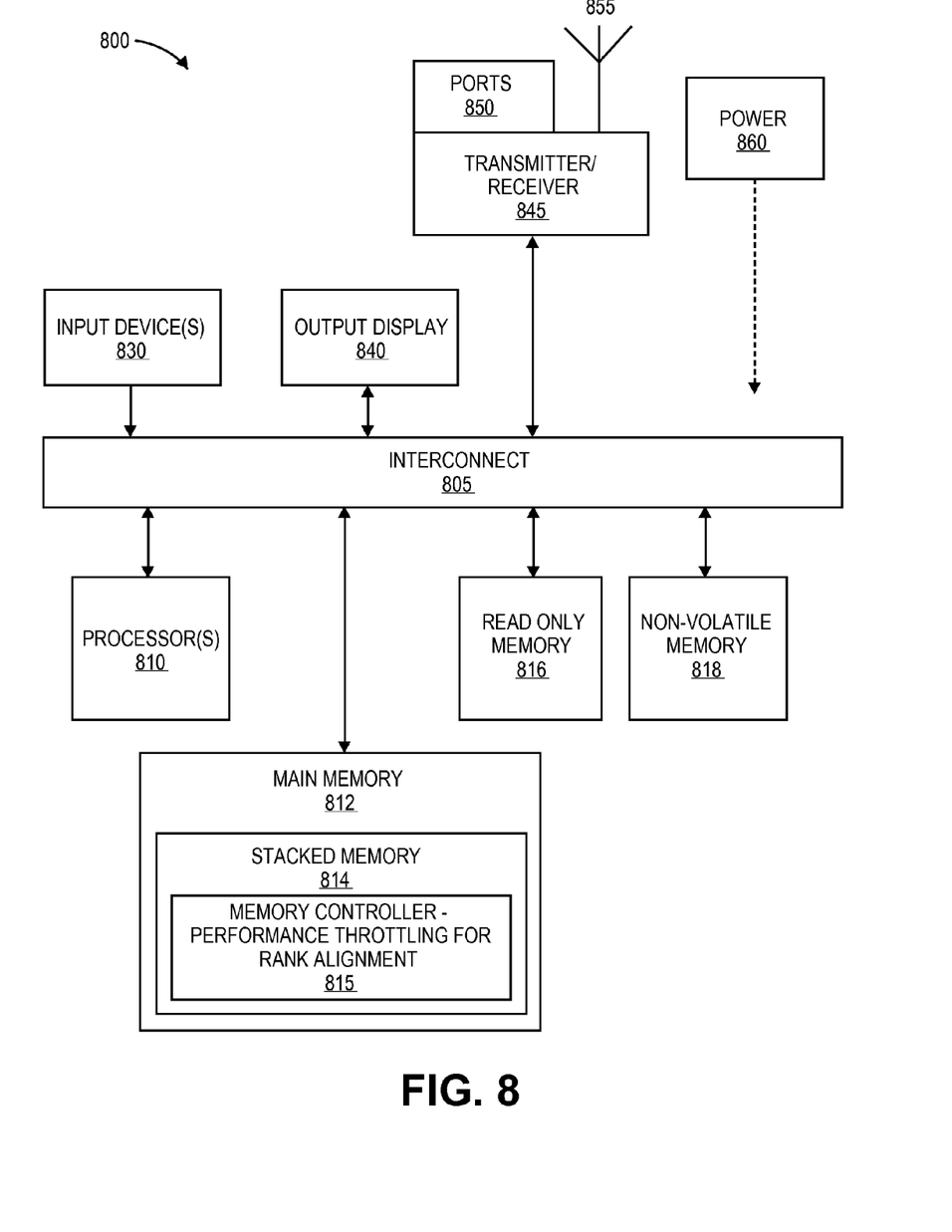
FIG. 8 illustrates an embodiment of a computing system including stacked memory.

FIG. 8 illustrates an embodiment of a computing system including stacked memory. The computing system may include a computer, server, game console, or other computing apparatus. In this illustration, certain standard and well-known components that are not germane to the present description are not shown. Under some embodiments, the computing system 800 comprises an interconnect or crossbar 805 or other communication means for transmission of data. The computing system 800 may include a processing means such as one or more processors 810 coupled with the interconnect 805 for processing information. The processors 810 may comprise one or more physical processors and one or more logical processors. The interconnect 805 is illustrated as a single interconnect for simplicity, but may represent multiple different interconnects or buses and the component connections to such interconnects may vary. The interconnect 805 shown in FIG. 8 is an abstraction that represents any one or more separate physical buses, point-to-point connections, or both connected by appropriate bridges, adapters, or controllers.

In some embodiments, the computing system 800 further comprises a random access memory (RAM) or other dynamic storage device or element as a main memory 812 for storing information and instructions to be executed by the processors 810. RAM memory includes dynamic random access memory (DRAM), which requires refreshing of memory contents, and static random access memory (SRAM), which does not require refreshing contents, but at increased cost. In some embodiments, main memory may include active storage of applications including a browser application for using in network browsing activities by a user of the computing system. DRAM memory may include synchronous dynamic random access memory (SDRAM), which includes a clock signal to control signals, and extended data-out dynamic random access memory (EDO DRAM). In some embodiments, memory of the system may include certain registers or other special purpose memory.

In some embodiments, the main memory 812 includes stacked memory 814, wherein the stacked memory includes a memory controller to provide performance throttling for rank alignment 815.

The computing system 800 also may comprise a read only memory (ROM) 816 or other static storage device for storing static information and instructions for the processors 810. The computing system 800 may include one or more non-volatile memory elements 818 for the storage of certain elements.

In some embodiments, the computing system 800 includes one or more input devices 830, where the input devices include one or more of a keyboard, mouse, touch pad, voice command recognition, gesture recognition, or other device for providing an input to a computing system.

The computing system 800 may also be coupled via the interconnect 805 to an output display 840. In some embodiments, the display 840 may include a liquid crystal display (LCD) or any other display technology, for displaying information or content to a user. In some environments, the display 840 may include a touch-screen that is also utilized as at least a part of an input device. In some environments, the display 840 may be or may include an audio device, such as a speaker for providing audio information.

One or more transmitters or receivers 845 may also be coupled to the interconnect 805. In some embodiments, the computing system 800 may include one or more ports 850 for the reception or transmission of data. The computing system 800 may further include one or more omnidirectional or directional antennas 855 for the reception of data via radio signals.

The computing system 800 may also comprise a power device or system 860, which may comprise a power supply, a battery, a solar cell, a fuel cell, or other system or device for providing or generating power. The power provided by the power device or system 860 may be distributed as required to elements of the computing system 800.

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form. There may be intermediate structure between illustrated components. The components described or illustrated herein may have additional inputs or outputs that are not illustrated or described.

Various embodiments may include various processes. These processes may be performed by hardware components or may be embodied in computer program or machine-executable instructions, which may be used to cause a general-purpose or special-purpose processor or logic circuits programmed with the instructions to perform the processes. Alternatively, the processes may be performed by a combination of hardware and software.

Portions of various embodiments may be provided as a computer program product, which may include a non-transitory computer-readable storage medium having stored thereon computer program instructions, which may be used to program a computer (or other electronic devices) for execution by one or more processors to perform a process according to certain embodiments. The computer-readable medium may include, but is not limited to, floppy diskettes, optical disks, compact disk read-only memory (CD-ROM), and magneto-optical disks, read-only memory (ROM), random access memory (RAM), erasable programmable read-only memory (EPROM), electrically-erasable programmable read-only memory (EEPROM), magnet or optical cards, flash memory, or other type of computer-readable medium suitable for storing electronic instructions. Moreover, embodiments may also be downloaded as a computer program product, wherein the program may be transferred from a remote computer to a requesting computer.

Many of the methods are described in their most basic form, but processes can be added to or deleted from any of the methods and information can be added or subtracted from any of the described messages without departing from the basic scope of the present invention. It will be apparent to those skilled in the art that many further modifications and adaptations can be made. The particular embodiments are not provided to limit the invention but to illustrate it. The scope of the embodiments of the present invention is not to be determined by the specific examples provided above but only by the claims below.

If it is said that an element "A" is coupled to or with element "B," element A may be directly coupled to element B or be indirectly coupled through, for example, element C. When the specification or claims state that a component, feature, structure, process, or characteristic A "causes" a component, feature, structure, process, or characteristic B, it means that "A" is at least a partial cause of "B" but that there may also be at least one other component, feature; structure, process, or characteristic that assists in causing "B." If the specification indicates that a component, feature, structure, process, or characteristic "may", "might", or "could" be included, that particular component, feature, structure, process, or characteristic is not required to be included. If the specification or claim refers to "a" or "an" element, this does not mean there is only one of the described elements.

An embodiment is an implementation or example of the present invention. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments of the present invention, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims are hereby expressly incorporated into this description, with each claim standing on its own as a separate embodiment of this invention.

What is claimed is:

1. A memory device comprising:
   a memory stack including a plurality of coupled memory elements, the memory elements including a plurality of ranks, the plurality of ranks including a first rank and a second rank; and
   a logic device including a memory controller;
   wherein the memory controller is to determine an amount of misalignment between data signals relating to a read request for the first rank and a read request for the second rank; and
   wherein upon a determination that misalignment between the first rank and the second rank is greater than a threshold, the memory controller is to insert a time shift between a data signal for the first rank and a data signal for the second rank.

2. The memory device of claim 1, wherein the memory controller is to conduct a realignment of read requests between the plurality of ranks when the memory device is in a state of reduced operations.

3. The memory device of claim 2, wherein the realignment includes the removal of the time shift between the first rank and the second rank.

4. The memory device of claim 2, wherein memory controller is to conduct the realignment when an interface of the memory device is powered down or when the memory enters a self-refresh state.

5. The memory device of claim 1, wherein the misalignment is a result of a heat gradient of the memory device.

6. The memory device of claim 1, wherein the misalignment is a result of timing characteristics of the memory elements of the memory stack.

7. The memory device of claim 1, wherein the memory device is a WideIO compatible device.

8. A method comprising:
   operating a stacked memory device, the memory device including a memory stack including a plurality of coupled memory elements, the memory elements including a plurality of ranks, the plurality of ranks including a first rank and a second rank;
   determining an amount of misalignment between data signals relating to a read request for the first rank and a read request for the second rank; and
   upon determining that misalignment between the first rank and the second rank is greater than a threshold, inserting a time shift between a data signal for the first rank and a data signal for the second rank.

9. The method of claim 8, further comprising conducting a realignment of read requests between the plurality of ranks when the memory device is in a state of reduced operations.

10. The method of claim 9, wherein conducting a realignment includes the removing the time shift between the first rank and the second rank.

11. The method of claim 9, wherein the realignment is conducted when an interface of the memory device is powered down or when the memory enters a self-refresh state.

12. The method of claim 8, wherein the misalignment is a result of a heat gradient of the memory device.

13. The method of claim 8, wherein the misalignment is a result of timing characteristics of the memory elements of the memory stack.

14. A system comprising:
   a processor to process data of the system;
   a transmitter, receiver, or both coupled with an omnidirectional antenna to transmit data, receive data, or both; and
   a memory to store data, the memory including a stacked memory device, the stacked memory device including:
      a memory stack including a plurality of coupled memory elements, the memory elements including a plurality of ranks, the plurality of ranks including a first rank and a second rank, and
      a logic device including a memory controller;
   wherein the memory controller is to determine an amount of misalignment between data signals relating to a read request for the first rank and a read request for the second rank; and
   upon a determination that misalignment between the first rank and the second rank is greater than a threshold, the memory controller is to insert a time shift between a data signal for the first rank and a data signal for the second rank.

15. The system of claim 14, wherein the memory controller is to conduct a realignment of read requests between the plurality of ranks when the memory device is in a state of reduced operations.

16. The system of claim 15, wherein the realignment includes the removal of the time shift between the first rank and the second rank.

17. The system of claim 15, wherein memory controller is to conduct the realignment when an interface of the memory device is powered down or when the memory enters a self-refresh state.

18. The system of claim 14, wherein the system is a mobile device.

19. The system of claim 18, wherein the mobile device is a tablet computer.

20. A non-transitory computer-readable storage medium having stored thereon data representing sequences of instructions that, when executed by a processor, cause the processor to perform operations comprising:

operating a stacked memory device, the memory device including a memory stack including a plurality of coupled memory elements, the memory elements including a plurality of ranks, the plurality of ranks including a first rank and a second rank;

determining an amount of misalignment between data signals relating to a read request for the first rank and a read request for the second rank; and upon determining that misalignment between the first rank and the second rank is greater than a threshold, inserting a time shift between a data signal for the first rank and a data signal for the second rank.

21. The medium of claim 20, further comprising instructions that, when executed by the processor, cause the processor to perform operations comprising:

conducting a realignment of read requests between the plurality of ranks when the memory device is in a state of reduced operations.

22. The medium of claim 21, wherein conducting a realignment includes the removing the time shift between the first rank and the second rank.

23. The medium of claim 21, wherein the realignment is conducted when an interface of the memory device is powered down or when the memory enters a self-refresh state.

* * * * *